(12) United States Patent
Sun et al.

(10) Patent No.: US 8,077,822 B2
(45) Date of Patent: Dec. 13, 2011

(54) SYSTEM AND METHOD OF CONTROLLING POWER CONSUMPTION IN A DIGITAL PHASE LOCKED LOOP (DPLL)

(75) Inventors: Bo Sun, Carlsbad, CA (US); Gary John Ballantyne, Christchurch (NZ); Gurkanwal Singh Sahota, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 889 days.

(21) Appl. No.: 12/111,541

(22) Filed: Apr. 29, 2008

(65) Prior Publication Data
US 2009/0268859 A1 Oct. 29, 2009

(51) Int. Cl.
*H03D 3/24* (2006.01)
(52) U.S. Cl. ........................................ 375/376
(58) Field of Classification Search ............... 375/376
See application file for complete search history.

(56) References Cited

U.S. PATENT DOCUMENTS

| | | | |
|---|---|---|---|
| 4,501,018 A * | 2/1985 | Shanley et al. ............... 455/83 |
| 5,276,913 A * | 1/1994 | Lee et al. ..................... 455/76 |
| 5,892,384 A * | 4/1999 | Yamada et al. ............. 327/277 |
| 6,121,816 A | 9/2000 | Tonks et al. |
| 6,429,707 B1 | 8/2002 | Lamb et al. |
| 6,696,829 B1 * | 2/2004 | Nguyen et al. ........... 324/76.53 |
| 7,664,213 B2 | 2/2010 | Hassan |
| 2005/0047494 A1 * | 3/2005 | Sasson et al. ............... 375/219 |
| 2005/0062505 A1 | 3/2005 | Takahashi |
| 2006/0119408 A1 * | 6/2006 | Chan et al. ................. 327/291 |

FOREIGN PATENT DOCUMENTS

EP 1467488 A1 10/2004

OTHER PUBLICATIONS

Fried, "Low-power digital PLL with one cycle frequency lock-in time and large frequency-multiplication factor for advanced power management," Proceedings of the Third IEEE International Conference on Electronics, Circuits, and Systems, 1996, ICECS '96, vol. 2, Publication Year: 1996 , pp. 1166-1169 vol. 2.*
International Search Report & Written Opinion—PCT/US2009/042105, International Search Authority—European Patent Office—Jul. 22, 2009.

* cited by examiner

*Primary Examiner* — Juan A Torres
(74) *Attorney, Agent, or Firm* — Larry J. Moskowitz (57) ABSTRACT

An apparatus comprising a programmable frequency device adapted to generate a reference clock selected from a set of distinct frequency clocks, wherein the programmable frequency device is further adapted to maintain the same temporal relationship of the triggering edges of the reference clock when switching between the distinct frequency clocks. The apparatus further comprises a phase locked loop (PLL), such as a digital PLL (DPLL), that uses the selected reference clock to establish a predetermined phase relationship between an input signal and an output signal. By maintaining substantially the same temporal relationship of the reference clock when switching between distinct frequency clocks, the continual and effective operation of the phase locked loop (PLL) is not significantly disturbed while changing the reference clock. This may be used to control the power consumption of the apparatus.

30 Claims, 5 Drawing Sheets

FIG. 5

SYSTEM AND METHOD OF CONTROLLING POWER CONSUMPTION IN A DIGITAL PHASE LOCKED LOOP (DPLL)

BACKGROUND

1. Field

The present disclosure relates generally to phase locked loops (PLL), and in particular, to a system and method of controlling power consumption in a digital phase locked loop (DPLL).

2. Background

Communication devices typically include a local oscillator (LO) for synchronously transmitting and receiving signals to and from other remote communication devices. Often these signals are sent or received via defined frequency channels. For selecting a particular frequency channel, the frequency of the LO is typically changed in order to properly transmit or receive the signal via the selected channel. Often a phase locked loop (PLL), such as a digital PLL (DPLL), is used to perform the change in the LO frequency.

A typical DPLL includes several digital devices, such as an input accumulator, a low pass filter (LPF) (often referred to as a "loop filter"), a digital controlled oscillator (DCO), a DCO accumulator, a time-to-digital converter (TDC), and other digital devices. Some of these digital devices use a reference clock to perform their intended function. For example, the input accumulator uses the reference clock to generate a signal indicative of the phase and frequency of an input signal to the DPLL. Also, the DCO accumulator and TDC use the reference clock to generate a signal indicative of the phase and frequency of the output signal of the DCO.

The power consumption of such digital devices is generally proportional or directly related to the frequency of the reference clock. Thus, the DPLL consumes more power when the frequency of the reference clock is relatively high, and less power when the frequency of the reference clock is relatively low. Often, communication devices that employ such DPLLs are portable devices that use limited power supplies, such as a battery, to operate on a continuous basis. In order to extend the continuous operation of such communication devices, it is preferred that the devices be operated in a low power mode whenever possible. One way this can be accomplished is by lowering the frequency of the reference clock when the communication device does not need to operate in a high performance model.

One issue with changing the frequency of the reference clock is that it should be done without significantly affecting the loop control of the DPLL. Prior approaches have been developed that allow for changing the frequency of the reference clock without significantly affect the loop control of the DPLL. However, these approaches typically take a substantial amount of time to perform the frequency change and the relocking operation, which in many applications may not be acceptable.

SUMMARY

An aspect of the disclosure relates to an apparatus comprising a programmable frequency device adapted to generate a reference clock selected from a set of distinct frequency clocks, wherein the programmable frequency device is further adapted to maintain the same temporal relationship of the triggering edges of the reference clock when switching between distinct frequency clocks. The apparatus further comprises a phase locked loop (PLL), such as a digital PLL (DPLL), that uses the selected reference clock to establish a predetermined phase relationship between an input signal and an output signal. By maintaining substantially the same temporal relationship of the reference clock when switching between distinct frequency clocks, the continual and effective operation of the phase locked loop (PLL) is not significantly disturbed while changing the frequency of the reference clock. This may be used to control the power consumption of the apparatus.

In yet another aspect of the disclosure, the programmable frequency device comprises a source of the distinct frequency clocks, which may comprise a cascaded chain of flip-flops adapted to be driven by a raw reference clock. In yet another aspect, the programmable frequency device comprises a circuit adapted to asynchronously receive an input frequency selection control signal that indicates a selection among the distinct frequency clock for the reference clock, and synchronously generate an output frequency selection control signal that causes the selection of the reference clock at a particular time. In still another aspect, the output frequency selection control signal is generated once a period of one of the distinct frequency clocks, such as the clock having the longest period. In another aspect, the output frequency selection control signal is generated in response to the distinct frequency clocks being at predetermined logic levels, such as all highs or all lows.

Other aspects, advantages and novel features of the present disclosure will become apparent from the following detailed description of the disclosure when considered in conjunction with the accompanying drawings.

DETAILED DESCRIPTION

Figure 1:
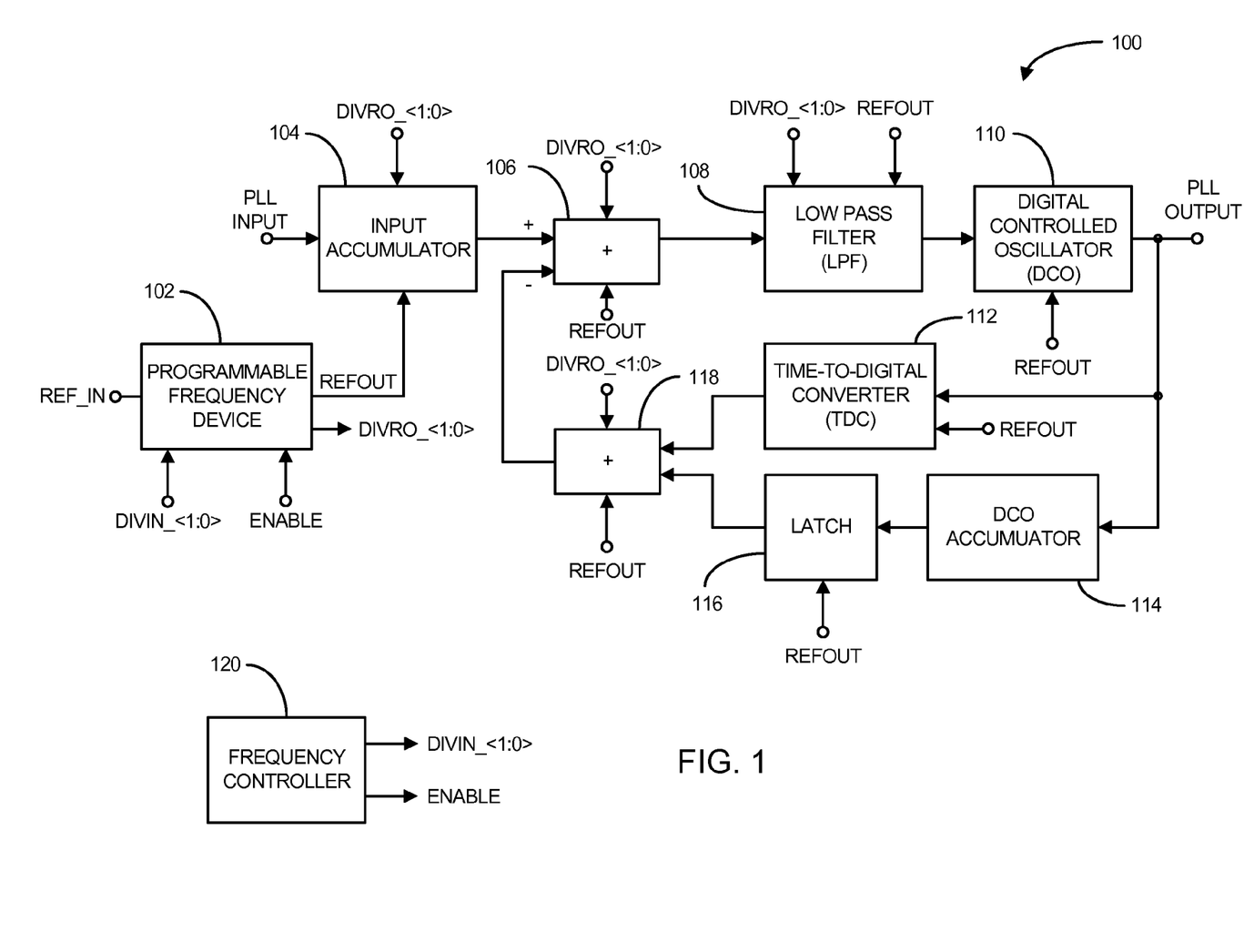
FIG. 1 illustrates a block diagram of an exemplary digital phase locked loop (DPLL) in accordance with an aspect of the disclosure.

FIG. 1 illustrates a block diagram of an exemplary digital phase locked loop (DPLL) 100 in accordance with an aspect of the disclosure. In summary, the DPLL allows for the programmability of the frequency of a reference clock for power consumption purposes without significantly affecting the loop control of the DPLL. The DPLL performs this by ensuring that the timing of the triggering edges of the reference clock does not substantially change as the reference clock frequency is changed. As previously discussed, the DPLL may be placed in a low power mode when the frequency of the reference clock is substantially decreased. Conversely, the DPLL may be placed in a high power mode when the frequency of the reference clock is substantially increased.

In particular, the DPLL comprises a programmable frequency device 102, an input accumulator 104, a first summing device 106, a low pass filter (LPF) or loop filter 108, a digital controlled oscillator (DCO) 110, a time-to-digital converter (TDC) 112, a DCO accumulator 114, a latch 116, a second summing device 118, and a frequency controller 120.

The programmable frequency device 102 receives an raw reference clock REF_IN and generates an output reference clock REFOUT based on input control signals ENABLE and DIVIN_<1:0>. The ENABLE signal enables the function of changing the reference clock frequency based on the frequency selection control signals DIVIN_<1:0>. If, for example, the ENABLE signal is deactivated or not-asserted, the programmable frequency device 102 merely passes the raw reference signal REF_IN to its output (e.g., REFOUT≅REF_IN). If, on the other hand, the ENABLE signal is activated or asserted, the programmable frequency device 102 generates the output reference clock REFOUT having a frequency related to the frequency the raw reference clock REF_IN and based on the frequency selection control signal DIVIN_<1:0>.

For example, if DIVIN_<1:0> is 00, the programmable frequency device 102 divides the frequency of the raw reference clock REF_IN by a factor of one (1) to generate the output reference clock REFOUT (e.g., $f_{REFOUT} \cong f_{REF\_IN}$). If DIVIN<1:0> is 01, the programmable frequency device 102 divides the frequency of the raw reference clock REF_IN by a factor of two (2) to generate the output reference clock REFOUT (e.g., $f_{REFOUT} \cong f_{REF\_IN}/2$). If DIVIN_<1:0> is 11, the programmable frequency device 102 divides the frequency of the raw reference clock REF_IN by a factor of four (4) to generate the output reference clock REFOUT (e.g., $f_{REFOUT} \cong f_{REF\_IN}/4$). And, if DIVIN_<1:0> is 10, the programmable frequency device 102 divides the frequency of the raw reference clock REF_IN by a factor of eight (8) to generate the output reference clock REFOUT (e.g., $f_{REFOUT} \cong f_{REF\_IN}/8$).

As previously discussed, the programmable frequency device 102 performs the change in frequency in a manner that the timing or temporal relationship of the triggering edges do not substantially change with changes in the frequency. This prevents or reduces the likelihood of a disruption in the loop control of the DPLL 100. The programmable frequency device 102 is also adapted to asynchronously receive the input frequency selection control signal DIVIN_<1:0>, and to synchronously generate an output frequency selection control signal DIVRO_<1:0> that instructs other modules of the DPLL 100 of the selected frequency for the output reference clock REFOUT.

The input accumulator 104 receives a PLL input and the output reference clock REFOUT, and generates an input phase signal. In essence, the input accumulator 104 comprises a counter that counts periods of the output reference signal by a number dictated by the PLL input. For example, if the PLL input is 10, then the counter counts by 10 (e.g., 0, 10, 20, 30, etc.) The PLL input dictates the ratio of the frequency of the DCO output to the frequency of the output reference clock REFOUT. For example, if the frequency of the output reference clock REFOUT is 100 MHz and the PLL input is 10, then the frequency of the DCO output (when the loop is locked) is at approximately 1 GHz. If the frequency selection control signal DIVRO_<1:0> is 00, the input accumulator 104 counts the periods of the output reference clock REFOUT by 1× the PLL input (e.g., because $f_{REFOUT} \cong f_{REF\_IN}$). If the frequency selection control signal DIVRO_<1:0> is 01, the input accumulator 104 counts the periods of the output reference clock REFOUT by 2× the PLL input (e.g., because $f_{REFOUT} \cong f_{REF\_IN}/2$). If the frequency selection control signal DIVRO_<1:0> is 11, the input accumulator 104 counts the periods of the output reference clock REFOUT by 4× the PLL input (e.g., because $f_{REFOUT} \cong f_{REF\_IN}/4$). And, if the frequency selection control signal DIVRO_<1:0> is 01, the input accumulator 104 counts the periods of the output reference clock REFOUT by 8× the PLL input (e.g., because $f_{REFOUT} \cong f_{REF\_IN}/8$).

The first summing device 106 receives the input phase signal from the input accumulator 104, and feedback phase signal from the second summing device 118, and generates a phase error signal indicative of the phase difference between the input phase signal and the feedback phase signal. For timing and error correction purposes, the first summing device 106 may receive the output reference clock REFOUT and the frequency selection control signal DIVRO_<1:0>. For example, the first summing device 106 may generate the phase error signal one (1) clock period of the output reference clock REFOUT after it has received the phase signals from the input accumulator 104 and the second summing device 118. Since the frequency, i.e., the clock period, of the REFOUT clock may be changed by the programmable frequency device 102, the first summing device 106 receives the frequency selection control signal DIVRO_<1:0> and the output reference clock REFOUT for the purpose of setting the proper delay for outputting the phase error signal.

The LPF or loop filter 108 filters the phase error signal from the first summing device 106 to generate a frequency control signal for the DCO 110. The transfer function of the loop filter 108 may be dependent on the frequency of the output reference clock REFOUT. Accordingly, the loop filter 108 also receives the output reference clock REFOUT and the frequency selection control signal DIVRO_<1:0> to inform it of the current frequency of the reference clock REFOUT. The loop filter 108 uses this information to adjust its transfer function in accordance with the current frequency of the output reference clock REFOUT.

The DCO 110 receives the frequency control signal from the loop filter 108 and the output reference clock REFOUT, and generates the PLL output signal that has a specified phase relationship with the input phase signal when the control loop is locked. The DCO accumulator 114 generates a signal indicative of a coarse measurement of the phase of the PLL output signal. In essence, the DCO accumulator 114 comprises a counter that incrementally counts periods of the PLL output signal. The latch 116 outputs the coarse phase information in response to a triggering edge of the output reference clock REFOUT.

The TDC 112 generates a signal indicative of a fine measurement of the phase of the PLL output signal. In particular, the TDC 112 comprises a chain of delay elements that receives the PLL output signal. The outputs of the delay elements are respectively coupled to the data inputs of flip-flops. The flip-flops are clocked by the output reference clock REFOUT. The Q-outputs of the flip-flops are coupled to a thermometer decoder, which generates a signal indicative of the fractional difference between the phase of the PLL output signal and the reference clock REFOUT. It shall be understood that a frequency divider may be situated between the output of the DCO 110 and the inputs of the DCO accumulator 114 and the TDC 112.

The second summing device 118 receives the coarse and fine phase signals respectively from the latch 116 and the TDC 112, and generates the feedback phase signal related to the phase of the PLL output signal. For timing and error correction purposes, the second summing device 118 may receive the output reference clock REFOUT and the frequency selection control signal DIVRO_<1:0>. For example, The second summing device 118 may generate the feedback phase signal one (1) clock period of the output reference clock REFOUT after it has received the phase information from the latch 116 and the TDC 112. Since the frequency, i.e., the clock period, of the output reference clock REFOUT may be changed by the programmable frequency device 102, the second summing device 118 receives the output reference clock REFOUT and the frequency selection control signal DIVRO_<1:0> to inform it of the current frequency of the output reference clock REFOUT. The second summing device 106 uses this information to select the proper delay for outputting the feedback phase signal.

The frequency controller 120 generates the input frequency selection DIVIN_<1:0> and ENABLE control signals for the programmable frequency device 102. Based on a specified power saving algorithm, the frequency controller 120 may cause the frequency of the reference clock REFOUT to decrease, for example, by a factor of two (2), four (4), or eight (8), in order to place the DPLL 100 in a specified power consumption mode. The frequency controller 120 may perform this reduction in the frequency of the reference clock REFOUT when the DPLL need not be operated in a high performance mode, and reduced power consumption resulting from the frequency decrease would prolong the continual operation of the device when being operated by a limited power supply, such as a battery. When high performance is needed by the DPLL 100, the frequency controller 120 may increment the frequency of the reference clock REFOUT so that better loop control is achieved. The frequency controller 120 may also disable altogether the frequency change function by deactivating or not asserting the ENABLE signal.

Figure 2:
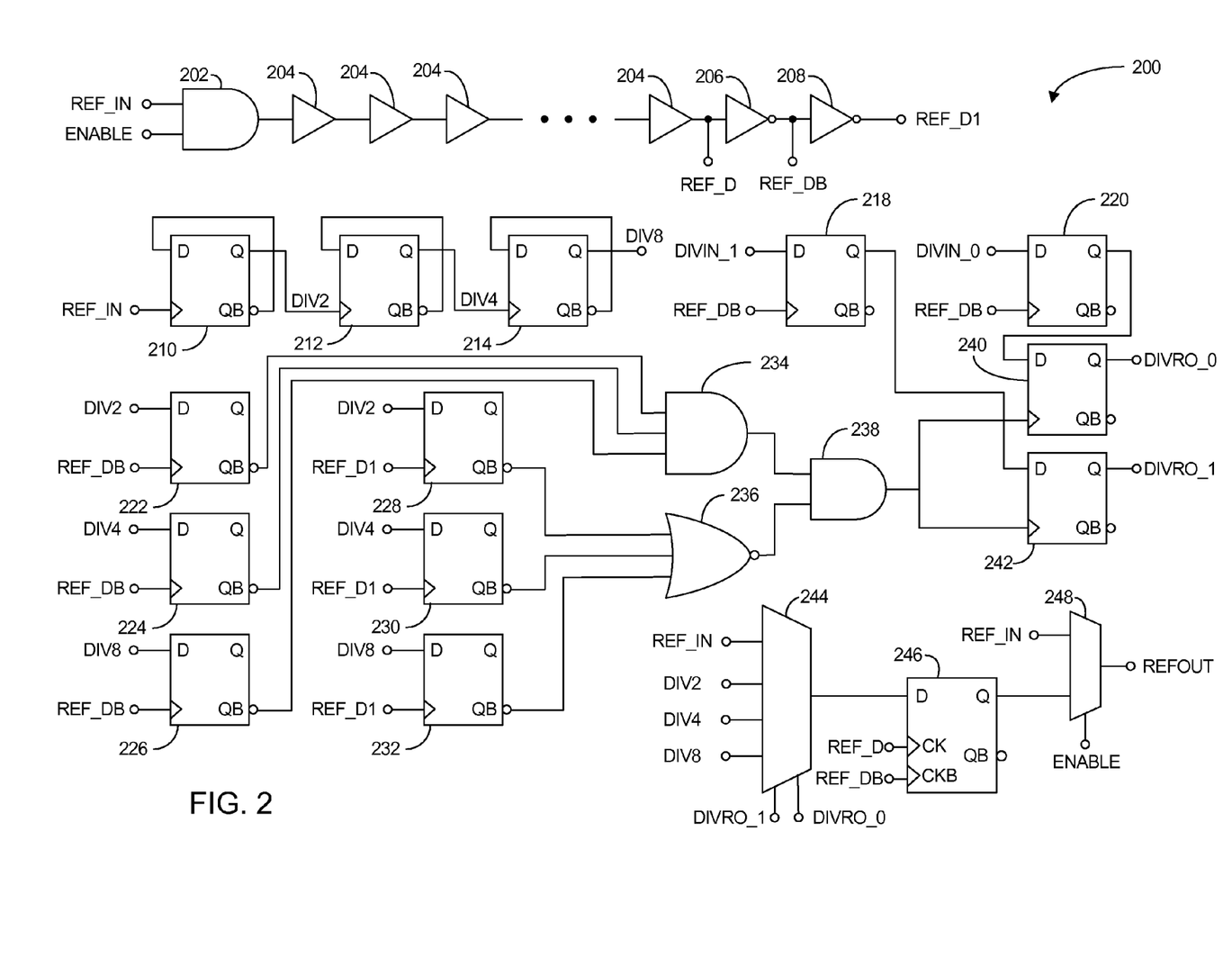
FIG. 2 illustrates a schematic diagram of an exemplary programmable frequency device in accordance with another aspect of the disclosure.

FIG. 2 illustrates a block diagram of an exemplary programmable frequency device 200 in accordance with another aspect of the disclosure. The programmable frequency device 200 is merely one example of a detailed implementation of the programmable frequency device 102 previously discussed. In particular, the programmable frequency device 200 responds to the control signal ENABLE to enable or disable the frequency division operation, and performs the proper frequency selection operation as dictated by the input frequency selection control signal DIVIN_<1:0>. Also, as previously discussed, the programmable frequency device 200 performs the frequency change such that the temporal relationship of the triggering edges (e.g., the rising edges) does not substantially change when switching between different frequencies of the output reference clock REFOUT. In this manner, the loop control is minimally disturbed by the change in the frequency of the reference clock REFOUT.

In particular, the programmable frequency device 200 comprises a first AND gate 202, a chain of delay elements 204, first and second inverters 206 and 208, a plurality of D flip-flops 210, 212, 214, 218, 220, 222, 224, 226, 228, 230, 232, 240, and 242, a three-input AND gate 234, a three-input NOR-gate 236, a second AND gate 238, a four-input multiplexer (MUX) 244, a two-clock D flip-flop 246, and a two-input MUX 248.

The AND gate 202 includes a first input adapted to receive the raw reference clock REF_IN and a second input adapted to receive the ENABLE control signal from the frequency controller 120. The AND gate 202 includes an output coupled to the input of the delay chain 204. The delay chain 204, in turn, includes an output coupled to an input of the first inverter 206, which, in turn, includes an output coupled to an input of the second inverter 208. As discussed in more detail below, three timing control signals REF_D, REF_DB, and REF_D1 are generated respectively at the outputs of the delay chain 204, first inverter 206, and second inverter 208.

The D flip-flop 210 includes a clock input adapted to receive the raw reference clock REF_IN, a QB output coupled to its data input, and a Q output coupled to the clock input of D flip-flop 212. The D flip-flop 212, in turn, includes a QB output coupled to its data input, and a Q output coupled to the clock input of D flip-flop 214. The D flip-flop 214 includes a QB output coupled to its data input. The three cascaded flip-flops 210, 212, and 214 operate to divide the frequency of the raw reference clock REF_IN to generate distinct frequency clocks DIV2, DIV4, and DIV8 respectively at the Q outputs of D flip-flops 210, 212, and 214. The clock DIV2 has a frequency substantially half of the frequency of the raw reference clock REF_IN; the clock DIV4 has a frequency substantially a fourth of the frequency of the raw reference clock REF_IN; and the clock DIV8 has a frequency substantially one-eighth of the frequency of the raw reference clock REF_IN.

The D flip-flop 222 includes a data input adapted to receive the clock DIV2, a clock input to receive the timing control signal REF_DB, and a QB output coupled to a first input of the three-input AND gate 234. Similarly, the D flip-flop 224 includes a data input adapted to receive the clock DIV4, a clock input to receive the timing control signal REF_DB, and a QB output coupled to a second input of the three-input AND gate 234. Additionally, the D flip-flop 226 includes a data input adapted to receive the clock DIV8, a clock input to receive the timing control signal REF_DB, and a QB output coupled to a third input of the three-input AND gate 234. As discussed in more detail below, the D flip-flops 222, 224, and 226 assist in establishing a time for synchronously triggering a change in the frequency of the output reference clock REFOUT.

The D flip-flop 228 includes a data input adapted to receive the clock DIV2, a clock input to receive the timing control signal REF_D1, and a QB output coupled to a first input of the three-input NOR gate 236. Similarly, the D flip-flop 230 includes a data input adapted to receive the clock DIV4, a clock input to receive the timing control signal REF_D1, and a QB output coupled to a second input of the three-input NOR gate 236. Additionally, the D flip-flop 232 includes a data input adapted to receive the clock DIV8, a clock input to receive the timing control signal REF_D1, and a QB output coupled to a third input of the three-input NOR gate 236. As discussed in more detail below, the D flip-flops 228, 230, and 232 assist in establishing a time for synchronously triggering a change in the frequency of the output reference clock REFOUT.

The three-input AND gate 234 includes an output coupled to a first input of the second AND gate 238. The three-input NOR gate 236 includes an output coupled to a second input of the second AND gate 238. The output of the second AND gate 238 is coupled to the clock inputs of the D flip-flops 240 and 242. The D flip-flop 218 includes a data input adapted to receive the input frequency selection control signal DIVIN_1 from the frequency controller 120, a clock input to receive the timing control signal REF_DB, and a Q output coupled to the data input of D flip-flop 242. The D flip-flop 220 includes a data input adapted to receive the input frequency selection control signal DIVIN_0 from the frequency controller 120, a clock input to receive the timing control signal REF_DB, and a Q output coupled to the data input of D flip-flop 240. Output frequency selection control signals DIVRO_0 and DIVRO_1 are generated at the respective Q outputs of D flip-flops 240 and 242.

The four-input MUX 244 includes four inputs adapted to receive the raw reference clock REF_IN, and the distinct frequency clocks DIV2, DIV4, and DIV8. The four-input MUX includes two selection inputs adapted to receive the output frequency selection control signals DIVRO_0 and DIVRI_1. The four-input MUX 244 includes an output coupled to the data input of the two-clock D flip-flop 246. The two-clock D flip-flop 246, in turn, includes a first clock input adapted to receive the timing control signal REF_D, and a second clock input adapted to receive the timing control signal REF_DB. The two-clock D flip-flop 246 includes a Q output coupled to a first input of the two-input MUX 248. The two-input MUX 248, in turn, includes a second input adapted to receive the raw reference clock REF_IN, and an output adapted to produce the output reference clock REFOUT. The operation of the programmable frequency device 200 will now be discussed.

Figure 3:
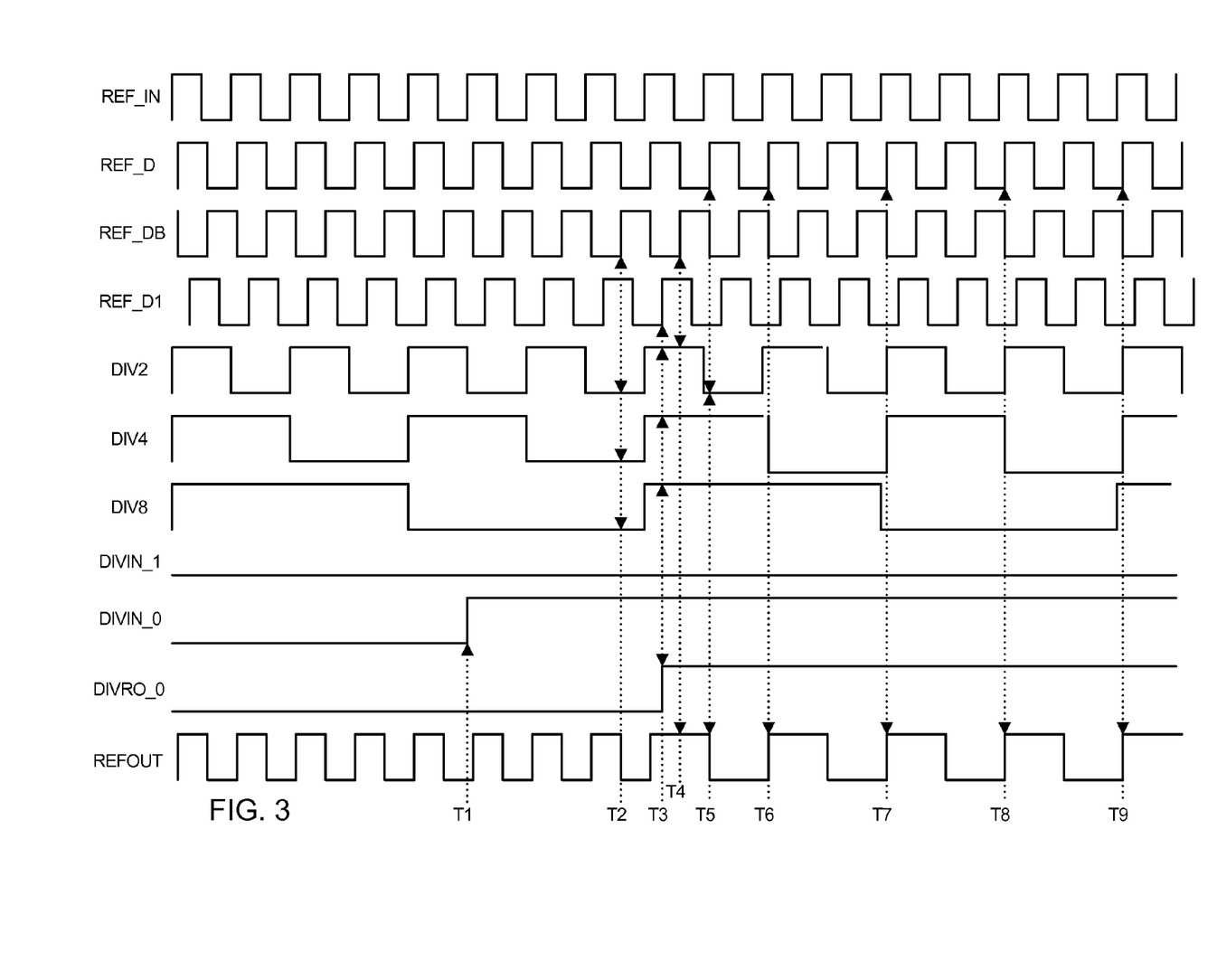
FIG. 3 illustrates a timing diagram of exemplary signals generated within the exemplary programmable frequency device in accordance with another aspect of the disclosure.

FIG. 3 illustrates a timing diagram of exemplary signals generated within the exemplary programmable frequency device 200 in accordance with another aspect of the disclosure. The top graph illustrates the raw reference clock REF_IN. The next graph illustrates the timing control signal REF_D. Note that the timing control signal REF_D is substantially a delayed version of the raw reference frequency REF_IN due to the delay chain 204. The next graph illustrates the timing signal REF_DB which is substantially the inverted timing control signal REF_D. The next graph illustrates the timing signal REF_D1 which is substantially a delayed version of the timing signal REF_D. The next three graphs illustrate the distinct frequency clocks DIV2, DIV4, and DIV8, respectively. The following pair of graphs illustrate an example of the input frequency selection control signals DIVIN_1 and DIVIN_0 generated by the frequency controller 120. The next graph illustrates an example of the output frequency selection control signal DIVRO_0. And, the final graph illustrates the output reference clock REFOUT.

The ENABLE control signal is used to enable or disable the frequency division function of the programmable frequency device 200. If the ENABLE control signal is not asserted, meaning that the programmable frequency division function is disabled, a low logic level appears at the ENABLE input of the AND gate 202. This basically disables the timing signals REF_D, REF_DB, and REF_D1. This in effect disables virtually all of the programmable frequency device 200. Also, the ENABLE control signal not being asserted causes the MUX 248 to output the raw reference clock REF_IN as the output reference clock REFOUT. Thus, by having the ENABLE control signal not asserted, the frequency division function may be bypassed.

On the other hand, if the ENABLE control signal is asserted, the AND gate 202 allows the raw reference clock REF_IN to be applied to the input of the delay chain 204, thereby allowing the generation of the timing control signals REF_D, REF_DB, and REF_D1. Additionally, the ENABLE control signal being asserted causes the MUX 248 to select the signal at the Q output of the two-clock D flip-flop 246 as the output reference clock REFOUT.

In this exemplary timing diagram, the initial values (prior to time T1) of the input frequency selection control signals DIVIN_<1:0> are set to 00, which, in turn, causes the D flip-flops 240 and 242 to set the output frequency selection control signals DIVRO_<1:0> to 00 when these flip-flops 240 and 242 are clocked. This causes the MUX 244 to output the raw reference clock REF_IN. Since the two-clock D flip-flop 246 is clocked by both timing signals REF_D and REF_DB, the Q output is essentially the raw reference clock REF_IN except that it is substantially timely aligned with the timing control signal REF_D. In this configuration, the timing control signal REF_D is used to clock out one-half period of the raw reference clock REF_IN, and the timing control signal REF_DB is used to clock out the other half period of the raw reference clock REF_IN.

The input frequency control signals DIVIN_<1:0> from the frequency controller 120 may be received by the programmable frequency device 200 asynchronous with the signals REF_IN, REF_D, REF_DB, etc. generated in the programmable frequency device 200. In this example, the DIVIN_0 control signal transitions from a logic low level to a high logic level at time T1, as noted in the timing diagram. This makes the control signal DIVIN_<1:0> to be 01, which instructs the programmable frequency device 200 to output the half-frequency clock DIV2 as the output reference clock REFOUT.

When the distinct frequency clocks DIV2, DIV4, and DIV8 are all at a low logic level, the D flip-flops 222, 224, and 226 clock out a high logic level at their respective QB outputs at substantially the triggering edge (e.g., rising edge) of the timing control signal REF_DB, e.g., at time T2 as indicated in the timing diagram. At this time T2, the inputs to the three-input AND gate 234 are at the high logic level, thereby causing the AND gate 234 to generate a high logic level. Similarly, when the distinct frequency clocks DIV2, DIV4, and DIV8 are all at the high logic level, the D flip-flops 228, 230, and 232 clock out a low logic level at their respective QB outputs at substantially the triggering edge (e.g., rising edge) of the timing control signal REF_D1, e.g., at time T3 as indicated in the timing diagram. At this time T3, the inputs to the three-input NOR gate 234 are at the low logic level, thereby causing the NOR gate 236 to generate a high logic level.

Accordingly, at time T3, both the AND gate 234 and the NOR gate 236 generate a high logic level at their respective outputs. Consequently, the inputs to the AND gate 238 are also at the high logic level, causing the AND gate 238 to transition its output from a low logic level to a high logic level. This produces a triggering edge at the clock inputs of the D flip-flops 240 and 242. Since the input frequency selection control signal DIVIN_<1:0> is now at 01, the D flip flops 240 and 242 also clock out the output frequency selection control signal DIVRO_<1:0> as a 01. This is shown in the timing diagram as a rising edge of DIVRO_0 at time T3. The output frequency selection control signals DIVRO_<1:0> becoming 01 at time T3 causes the MUX 244 to output of frequency divided clock DIV2. At time T4 as indicated in the timing diagram, the timing control signal REF_DB causes the two-clock D flip-flop 246 to clock out the selected clock DIV2. It is noted that at time T4, the output reference clock REFIN and clock DIV2 are at the high logic level, thus the logic level of the output reference clock REFOUT does not change at that time. However, at time T5, the triggering edge (e.g., rising edge) of timing control signal REF_D causes the two-clock D flip-flop to output a low logic level because the DIV2 clock is at a low logic level at such time.

In summary, when enabled, the programmable frequency device 102 generates an output reference clock REFOUT that has substantially the same triggering edges as that of timing signal REF_D. This is shown in the diagram where the triggering edges of the output reference clock REFOUT at times T6-T9 substantially line up with the timing edges of the timing control signal REF_D. This is due to the timing control signal REF_D being used to clock out the selected REF_IN, DIV2, DIV4, or DIV8 clock. Thus, when changing between the clocks REF_IN, DIV2, DIV4, and DIV8, the triggering edges substantially line up, and thus does not significantly disturb the operation of the control loop of the DPLL.

In summary, when enabled, the programmable frequency device 102 generates an output reference clock REFOUT that has substantially the same triggering edges as that of timing signal REF_D. This is sown in the diagram where the triggering edges of the output reference clock REFOUT at times T6-T9 substantially line up with the timing edges of the timing control signal REF_D. This is due to the timing control signal REF_D being used to clock out the selected REF_IN, DIV2, DIV4, or DIV8 clock. Thus, when changing between the clocks REF_IN, DIV2, DIV4, and DIV8, the triggering edges substantially line up, and thus does not significantly disturb the operation of the control loop of the DPLL.

Additionally, the circuit comprising the D flip-flops 222, 224, 226, 228, 230, and 232, the three-input AND gate 234, the three-input NOR gate 236, and the AND gate 238 generate a triggering edge to cause the output frequency selection control signals DIVRO_<1:0> to change at the selection inputs of the MUX 244 so as to cause the frequency change at a particular time. In this example, the triggering occurs every eight (8) cycles of the raw reference clock REF_IN or once per cycle of the clock DIV8. The circuit comprising the D flip-flops 218, 220, 240, 242 allows the input frequency selection control signals DIVIN_<1:0> to be received asynchronous, and generate the output frequency selection control signals DIVRO_<1:0> synchronously to effectuate the frequency change at the specified time.

The circuit comprising the AND gate 202, delay chains 204, and inverters 206, and 208 operate to generate the timing signals REF_D, REF_DB, and REF_D1 when the ENABLE control signal is asserted, and effectively disable the frequency division function of the programmable frequency device 200 when the ENABLE control signal is not asserted. The circuit comprising the D flip-flops 210, 212, and 214 generate the distinct frequency clocks DIV2, DIV4, and DIV8, which are sources for the different frequencies of the output reference clock REFOUT. Finally, the MUX 248 allows the frequency division function to be bypassed when the ENABLE control signal is not asserted, by merely passing the raw reference clock REF_IN to its output.

Figure 4:
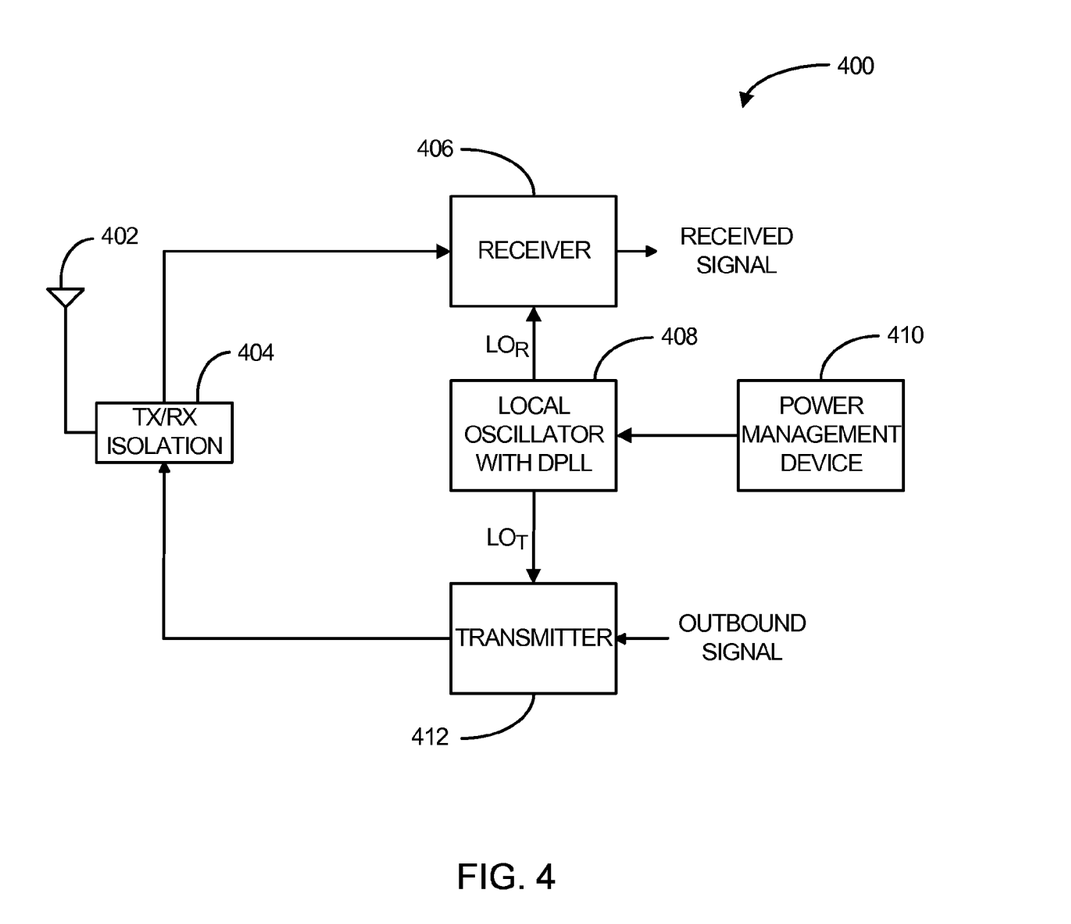
FIG. 4 illustrates a block diagram of an exemplary communication device in accordance with another aspect of the disclosure.

FIG. 4 illustrates a block diagram of an exemplary communications device 400, such as a transceiver, in accordance with another aspect of the disclosure. In summary, the transceiver 400 serves as one exemplary application of the DPLL previously discussed. In particular, the transceiver 400 includes a power management device that controls the frequency of the output reference clock REFOUT of the DPLL. In this manner, the power management device lowers the frequency of the output reference clock REFOUT of the DPLL when high performance is not needed, and raises the frequency of the output reference clock REFOUT when higher performance is not needed.

More specifically, the transceiver 400 comprises an antenna 402, a transmit/receive (TX/RX) isolation device 404, a receiver 406, a local oscillator (LO) 408 including a DPLL as previously discussed, a power management device 410, and a transmitter 412. The antenna 402 serves to receive radio frequency (RF) signals from one or more remote communication devices via a wireless medium, and to transmit RF signals to one or more remote communication devices via the wireless medium. The TX/RX isolation device 404 serves to route the received signal to the receiver 406, and route transmit signal to the antenna 402 while substantially isolating the input of the receiver 406 from the transmit signal. The receiver 406 serves to down convert the received RF signal to an intermediate frequency (IF) or baseband signal. The transmitter 412 serves to up convert an IF or baseband outbound signal to an RF signal. The local oscillator (LO) 408 including the DPLL as discussed above provides a received local oscillating source LOR for the receiver 406 so it can perform its down converting function. Similarly, the local oscillator (LO) 408 provides a transmit local oscillating source LOT for the transmitter 412 so it can perform its up converting function.

As discussed in more detail below, the power management device 410 controls the frequency of the output reference clock REFOUT of the DPLL of the local oscillator 408 in response to performance and power consumption requirements. As an example, when high performance of the DPLL is required, the power management device 410 may set the frequency of the output reference clock REFOUT to be substantially the same as that of the raw reference clock REFIN (e.g., frequency division=1). As another example, when low performance of the DPLL is acceptable and conservation of power is desired, the power management device 410 may set the frequency of the output reference clock REFOUT to substantially the frequency of the DIV8 clock (e.g., frequency division=8). As yet another example, when medium performance of the DPLL is acceptable and power consumption is desired as well, the power management device 410 may set the frequency of the output reference clock REFOUT to substantially that of the frequency of the DIV2 or DIV4 clock (e.g., frequency division=2 or 4).

Figure 5:
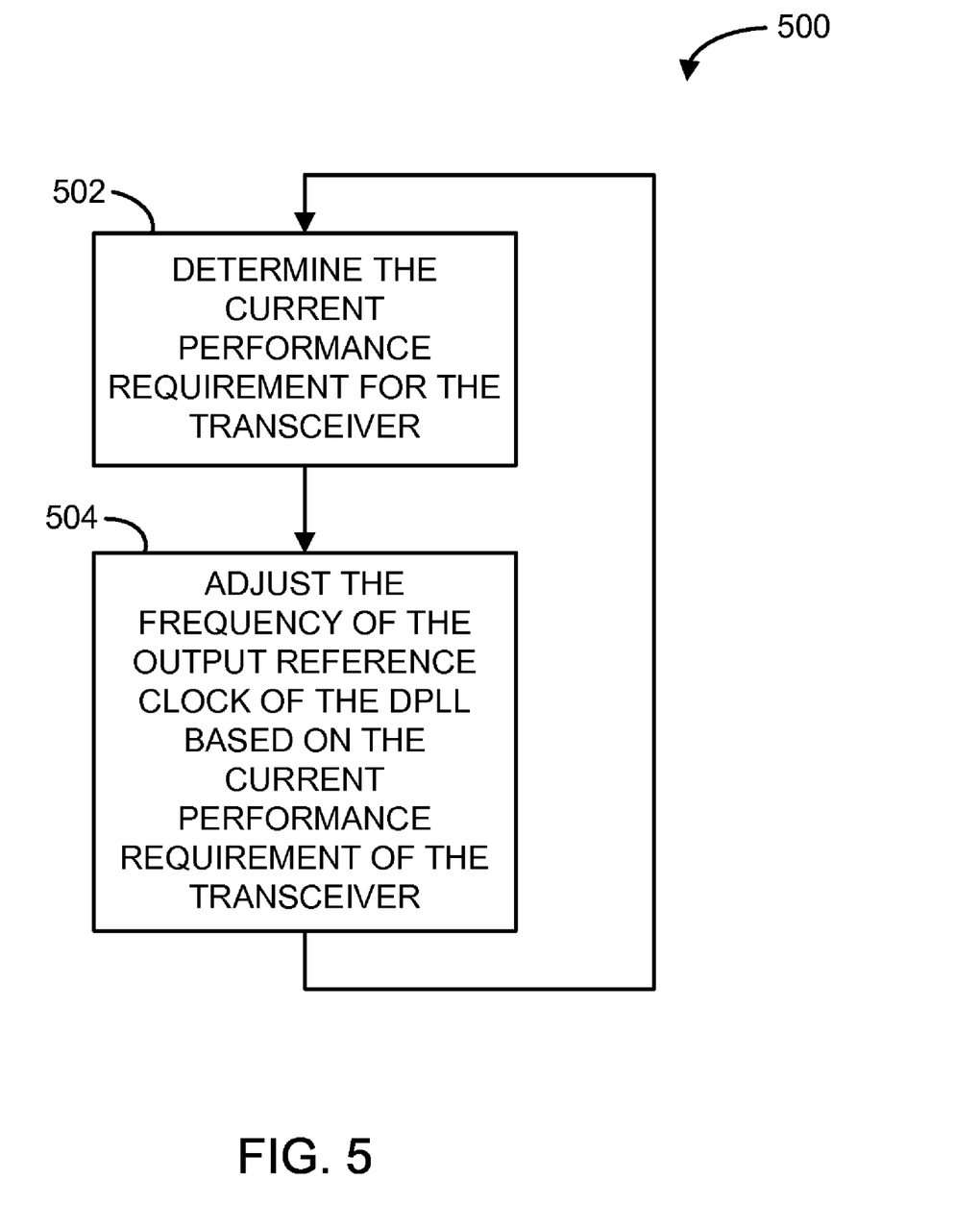
FIG. 5 illustrates a flow diagram of an exemplary method of controlling power consumption in the exemplary communication device in accordance with another aspect of the disclosure.

FIG. 5 illustrates a flow diagram of an exemplary method 500 of controlling power consumption in the exemplary transceiver 400 in accordance with another aspect of the disclosure. According to the method 500, the power management device 410 determines the current performance requirement for the transmitter 400 (block 502). The power management device 410 then adjust the frequency of the output reference clock of the DPLL based on the current performance requirement of the transceiver 400 (block 504). This process may be repeated as necessary to achieve a desired tradeoff between performance and power consumption over continual operation of the transceiver 400. Although a transceiver was used to exemplify a particular application of the DPLL, it shall be understood that the DPLL may be used in other applications, such as in a receiver, a transmitter, a clock and data recovery device, and others.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:
1. An apparatus, comprising:
 a programmable frequency device adapted to generate a reference clock selected from a set of distinct frequency clocks, and further adapted to maintain substantially the same temporal relationship of the triggering edges of the reference clock when switching between the distinct frequency clocks; and
 a phase locked loop (PLL) circuit adapted to establish a predetermined phase relationship between an input signal and an output signal using the reference clock.

2. The apparatus of claim 1, wherein the phase locked loop (PLL) comprises an input accumulator adapted to generate the input signal using the reference clock.

3. The apparatus of claim 1, wherein the phase locked loop (PLL) comprises a latch or time-to-digital converter (TDC) adapted to generate a signal related to a phase of the output signal using the reference clock.

4. The apparatus of claim 1, wherein the programmable frequency device generates the set of distinct frequency clocks from a raw reference clock, wherein the raw reference clock has edges, and wherein the programmable frequency device switches between the distinct frequency clocks such that all edges of the reference clock are substantially time aligned with the edges of the raw reference clock.

5. The apparatus of claim 1, wherein the PLL is a digital phase locked loop (DPLL) comprising a time-to-digital converter (TDC) and an input accumulator, wherein the TDC is adapted to receive the reference clock and the output signal, and wherein the input accumulator is adapted to receive the reference clock and the input signal.

6. The apparatus of claim 5, wherein the programmable frequency device comprises a source of the distinct frequency clocks.

7. The apparatus of claim 6, wherein the source of the distinct frequency clocks comprises a cascaded chain of flip-flops adapted to receive a raw reference clock.

8. The apparatus of claim 5, wherein the programmable frequency device comprises a circuit adapted to asynchronously receive an input frequency selection control signal that indicates a selection among the distinct frequency clocks for the reference clock, and synchronously generate an output frequency selection control signal that causes the selection of the reference clock at a particular time.

9. The apparatus of claim 8, wherein the circuit is adapted to synchronously generate the output frequency selection control signal in response to the distinct frequency clocks being at predetermined logic levels.

10. The apparatus of claim 8, wherein the programmable frequency device further comprises a first multiplexer adapted to output the selected clock from among the distinct frequency clocks in response to the output frequency selection control signal.

11. The apparatus of claim 8, wherein the phase locked loop (PLL) comprises an input accumulator adapted to generate the input signal based on the output frequency selection control signal.

12. The apparatus of claim 8, wherein the phase locked loop (PLL) comprises a phase error device adapted to generate a phase error signal related to a phase difference between the input signal and the output signal, wherein a delay in generating the phase error signal is based on the output frequency selection control signal.

13. The apparatus of claim 5, further comprising a flip-flop adapted to clock out the reference clock in response to a timing control signal.

14. An apparatus, comprising:
a programmable frequency device adapted to generate a reference clock selected from a set of distinct frequency clocks, and further adapted to maintain substantially the same temporal relationship of the triggering edges of the reference clock when switching between the distinct frequency clocks; and
a phase locked loop (PLL) circuit adapted to establish a predetermined phase relationship between an input signal and an output signal using the reference clock, wherein the programmable frequency device comprises a circuit adapted to asynchronously receive an input frequency selection control signal that indicates a selection among the distinct frequency clocks for the reference clock, and synchronously generate an output frequency selection control signal that causes the selection of the reference clock at a particular time, and wherein the circuit generates the output frequency selection control signal once a period of one of said distinct frequency clocks.

15. The apparatus of claim 14, wherein the one of said distinct frequency clocks includes the clock having the longest period among the distinct frequency clocks.

16. An apparatus, comprising:
a programmable frequency device adapted to generate a reference clock selected from a set of distinct frequency clocks, and further adapted to maintain substantially the same temporal relationship of the triggering edges of the reference clock when switching between the distinct frequency clocks; and
a phase locked loop (PLL) circuit adapted to establish a predetermined phase relationship between an input signal and an output signal using the reference clock, wherein the programmable frequency device comprises a circuit adapted to asynchronously receive an input frequency selection control signal that indicates a selection among the distinct frequency clocks for the reference clock, and synchronously generate an output frequency selection control signal that causes the selection of the reference clock at a particular time, and wherein the phase locked loop (PLL) comprises a filter including a transfer function based on the output frequency selection control signal.

17. An apparatus, comprising:
a programmable frequency device adapted to generate a reference clock selected from a set of distinct frequency clocks, and further adapted to maintain substantially the same temporal relationship of the triggering edges of the reference clock when switching between the distinct frequency clocks; and
a phase locked loop (PLL) circuit adapted to establish a predetermined phase relationship between an input signal and an output signal using the reference clock, wherein the programmable frequency device comprises a circuit adapted to asynchronously receive an input frequency selection control signal that indicates a selection among the distinct frequency clocks for the reference clock, and synchronously generate an output frequency selection control signal that causes the selection of the reference clock at a particular time, wherein the phase locked loop (PLL) comprises an accumulator adapted to generate a first signal related to a coarse value of the phase of the output signal, and a time-to-digital converter (TDC) adapted to generate a second signal related to a fine value of the phase of the output signal, and a device adapted to generate a feedback phase signal related to a combination of the first and second signals, and wherein a delay in generating the feedback phase signal is based on the output frequency selection control signal.

18. A method of providing a reference clock, comprising:
selecting a first clock from a set of distinct frequency clocks;
providing the first clock as the reference clock;
selecting a second clock from the set of distinct frequency clocks, wherein a first frequency of the first clock is different than a second frequency of the second clock;
providing the second clock as the reference clock, wherein the temporal relationship of triggering edges of the second clock is substantially the same as the temporal relationship of triggering edges of the first clock;
providing the reference clock to an input accumulator of a digital phase locked loop (DPLL); and
providing the reference clock to a time-to-digital converter (TDC) of the DPLL.

19. The method of claim 18, further comprising generating the distinct frequency clocks.

20. The method of claim 18, wherein the distinct frequency clocks comprises generating the distinct frequency clocks by dividing a frequency of a raw reference clock.

21. The method of claim 18, further comprising receiving a first frequency selection control signal for selecting the second clock as the reference clock, wherein selecting the second clock as the reference clock is performed responsive to the first frequency selection control signal.

22. The method of claim 21, wherein receiving the first frequency selection control signal comprises asynchronously receiving the first frequency selection control signal, and further comprising synchronously generating a second frequency selection control signal, and further wherein selecting the second clock as the reference clock is performed responsive to the second frequency selection control signal.

23. The method of claim 18, further comprising:
providing the reference clock to a digital controlled oscillator (DCO) of the DPLL.

24. A method of providing a reference clock, comprising:
selecting a first clock from a set of distinct frequency clocks;
providing the first clock as the reference clock;
selecting a second clock from the set of distinct frequency clocks, wherein a first frequency of the first clock is different than a second frequency of the second clock;
providing the second clock as the reference clock, wherein the temporal relationship of triggering edges of the second clock is substantially the same as the temporal relationship of triggering edges of the first clock;
receiving a first frequency selection control signal for selecting the second clock as the reference clock, wherein selecting the second clock as the reference clock is performed responsive to the first frequency selection control signal, wherein receiving the first frequency selection control signal comprises asynchronously receiving the first frequency selection control signal; and
synchronously generating a second frequency selection control signal, wherein selecting the second clock as the reference clock is performed responsive to the second frequency selection control signal, and wherein generating the second frequency selection control signal comprises generating the second frequency selection control signal once a period of one of said distinct frequency clock.

25. The method of claim 22, wherein generating the second frequency selection control signal comprises generating the second frequency selection control signal in response to the distinct frequency clocks being at predetermined logic levels.

26. An apparatus, comprising:
means for generating a reference clock selected from a set of distinct frequency clocks;
means for maintaining substantially the same temporal relationship of the triggering edges of the reference clock when switching between the distinct frequency clocks;
means for establishing a predetermined phase relationship between an input signal and an output signal using the reference clock;
means for asynchronously receiving a first frequency selection control signal that indicates a selection among the distinct frequency clocks for the reference clock; and
means for synchronously generating a second frequency selection control signal that causes the selection of the reference clock at a particular time, wherein the means for synchronously generating the second frequency selection control signal is adapted to generate the second frequency selection control signal once a period of one of said distinct frequency clocks.

27. An apparatus, comprising:
means for receiving a raw reference clock and generating therefrom a set of distinct frequency clocks, wherein the raw reference clock has a plurality of edges, wherein each of the frequency clocks of the set has a plurality of edges, and wherein the means is also for selecting a first of the frequency clocks of the set and for outputting the selected frequency clock as the reference clock and then switching to select a second of the frequency clocks and for outputting the second selected frequency clock as the reference clock such that all edges of the reference clock are substantially time aligned with edges of the raw reference clock both before and after the switching; and
a Digital Phase Locked Loop (DPLL) comprising an input accumulator and a Time-to-Digital Converter (TDC), wherein the input accumulator is adapted to receive a DPLL input signal and the reference clock, and wherein the TDC is adapted to receive a DPLL output signal and the reference clock.

28. The apparatus of claim 27, wherein the DPLL further includes a Digital Controlled Oscillator (DCO), and wherein the DCO is adapted to output the DPLL output signal and to receive the reference clock.

29. A non-transitory processor-readable medium storing processor-readable instructions, wherein execution of the processor-readable instructions is for:
(a) causing a frequency controller to send a programmable frequency device an input frequency selection control signal such that the programmable frequency device switches from outputting a first frequency clock as a reference clock to outputting a second frequency clock as the reference clock, wherein the programmable frequency device receives a raw reference clock and generates therefrom the first frequency clock and the second frequency clock, wherein the raw reference clock has a plurality of edges, wherein the reference clock as a plurality of edges, and wherein the switching occurs such that all edges of the reference clock are substantially time aligned with edges of the raw reference clock both before and after the switching.

30. The non-transitory processor-readable medium of claim 29, wherein execution of the processor-readable instructions is also for:
(b) determining a performance requirement and in response to the determining causing the frequency controller to send the input frequency selection control signal in (a).

\* \* \* \* \*